(12) United States Patent
Ohba et al.

(10) Patent No.: US 11,456,189 B2
(45) Date of Patent: Sep. 27, 2022

(54) MEMBER FOR SEMICONDUCTOR MANUFACTURING APPARATUSES

(71) Applicant: NGK Insulators, Ltd., Nagoya (JP)

(72) Inventors: Kazuma Ohba, Handa (JP); Tetsuya Kawajiri, Handa (JP); Takashi Kataigi, Handa (JP)

(73) Assignee: NGK Insulators, Ltd., Nagoya (JP)

( * ) Notice: Subject to any disclaimer, the term of this patent is extended or adjusted under 35 U.S.C. 154(b) by 635 days.

(21) Appl. No.: 14/195,087

(22) Filed: Mar. 3, 2014

(65) Prior Publication Data

US 2014/0272421 A1 Sep. 18, 2014

(30) Foreign Application Priority Data

Mar. 18, 2013 (JP) .............................. JP2013-054840

(51) Int. Cl.
*H01L 21/67* (2006.01)
*B32B 15/04* (2006.01)
*B32B 7/12* (2006.01)
*H01L 21/683* (2006.01)
*B32B 18/00* (2006.01)

(52) U.S. Cl.
CPC ............... *H01L 21/67* (2013.01); *B32B 7/12* (2013.01); *B32B 15/04* (2013.01); *B32B 18/00* (2013.01); *H01L 21/67103* (2013.01); *H01L 21/6833* (2013.01); *Y10T 428/31522* (2015.04)

(58) Field of Classification Search
CPC ............... H01L 21/67; H01L 21/6833; H01L 21/67103; B32B 15/04; B32B 18/00; B32B 7/12; Y10T 428/31522
See application file for complete search history.

(56) References Cited

U.S. PATENT DOCUMENTS

| 4,026,831 | A | 5/1977 | Moriya et al. |
| 6,166,897 | A | 12/2000 | Matsunaga |
| 6,720,072 | B1* | 4/2004 | Hinterwaldner ..... A61K 6/0008 |
| | | | 428/403 |
| 2003/0178638 | A1 | 9/2003 | Fujii |
| 2005/0046021 | A1 | 3/2005 | Hosokawa |
| 2006/0003127 | A1* | 1/2006 | Park ......................... B29C 71/04 |
| | | | 428/36.9 |

(Continued)

FOREIGN PATENT DOCUMENTS

| EP | 1 986 228 A1 | 10/2008 |
| JP | 04-287344 A | 10/1992 |

(Continued)

OTHER PUBLICATIONS

Kawaminami et al., JP10-270540 machine translation, Mar. 26, 1997.*

(Continued)

*Primary Examiner* — John D Freeman
(74) *Attorney, Agent, or Firm* — Burr & Brown, PLLC

(57) ABSTRACT

A member for semiconductor manufacturing apparatuses, which includes a ceramic electrostatic chuck and a cooling plate bonded together with a thermosetting sheet, is provided. The thermosetting sheet is made of a cured epoxy-acrylic adhesive. The adhesive contains (A) an epoxy resin capable of hydrogen transfer type polyaddition, (B) an acrylate or methacrylate polymer, and (C) a curing agent.

7 Claims, 2 Drawing Sheets

(56) References Cited

U.S. PATENT DOCUMENTS

| | | | |
|---|---|---|---|
| 2009/0004829 A1* | 1/2009 | Saiki | C09J 7/02 |
| | | | 438/464 |
| 2009/0162650 A1* | 6/2009 | Hong | C09D 163/00 |
| | | | 428/354 |
| 2009/0246915 A1 | 10/2009 | Ichikawa et al. | |
| 2010/0129045 A1 | 5/2010 | Shibata et al. | |
| 2010/0177455 A1* | 7/2010 | Yoshioka | H01L 21/67132 |
| | | | 361/234 |
| 2011/0096461 A1* | 4/2011 | Yoshikawa | H01L 21/6833 |
| | | | 361/234 |
| 2012/0028057 A1* | 2/2012 | Aihara | C04B 35/6269 |
| | | | 428/457 |

FOREIGN PATENT DOCUMENTS

| | | | |
|---|---|---|---|
| JP | 06-212139 | A1 | 8/1994 |
| JP | 10270540 | * | 3/1997 |
| JP | 2003-273202 | A1 | 9/2003 |
| JP | 2012-099561 | A1 | 5/2012 |
| KR | 10-2010-0083742 | A | 7/2010 |
| KR | 10-2011-0046301 | A | 5/2011 |
| TW | 200904928 | A | 2/2009 |
| TW | 201041077 | A | 11/2010 |

OTHER PUBLICATIONS

Extended European Search Report (Application No. 14159711.2) dated May 12, 2014.
Chinese Office Action, Chinese Application N. 201410100477.7, dated Mar. 31, 2017 (6 pages).
Taiwanese Office Action, Taiwanese Application No. 20140108596, dated Jun. 2, 2017 (6 pages).
Korean Office Action (with English translation), Korean Application No. 10-2014-0029072, dated Apr. 9, 2020, (10 pages).

* cited by examiner

MEMBER FOR SEMICONDUCTOR MANUFACTURING APPARATUSES

BACKGROUND OF THE INVENTION

1. Field of the Invention

The present invention relates to a member for semiconductor manufacturing apparatuses.

2. Description of Related Art

Known members for semiconductor manufacturing apparatuses include heaters, electrostatic chucks, rings, and showerheads. For example, one known electrostatic chuck heater includes a ceramic electrostatic chuck, which includes an electrostatic electrode and a heater electrode buried therein, and a metallic cooling plate for supporting the electrostatic chuck and releasing generated heat (see Patent Literature 1). The ceramic electrostatic chuck is bonded to the metallic cooling plate with an epoxy adhesive.

CITATION LIST

Patent Literature

[PTL 1] JP 4-287344 A

SUMMARY OF THE INVENTION

However, common resins have the problem of insufficient heat resistance at 100° C. Although high-temperature epoxy adhesive sheets are known, they have high modulus of elasticity, and an electrostatic chuck and a cooling plate bonded together sometimes warp or break. Although epoxy adhesive sheets having low modulus of elasticity are known, curing of the epoxy adhesive sheets are sometimes associated with the generation of gas, or the physical properties of the epoxy adhesive sheets sometimes vary significantly with heat cycles.

The present invention is devised to solve such problems. It is a principal object of the present invention to provide a member for semiconductor manufacturing apparatuses that includes a ceramic component and a metal component bonded together with a thermosetting sheet and is resistant to high temperatures.

The present invention is directed to a member for semiconductor manufacturing apparatuses that includes a ceramic component and a metal component bonded together with a thermosetting sheet, wherein the thermosetting sheet is made of a cured epoxy-acrylic adhesive, and the adhesive contains (A) an epoxy resin capable of hydrogen transfer type polyaddition, (B) an acrylate or methacrylate polymer, and (C) a curing agent.

Although a member for semiconductor manufacturing apparatuses according to the present invention includes a ceramic component and a metal component bonded together with a thermosetting sheet, the member for semiconductor manufacturing apparatuses is resistant to high temperatures.

DETAILED DESCRIPTION OF THE PRESENT INVENTION

Figure 1:
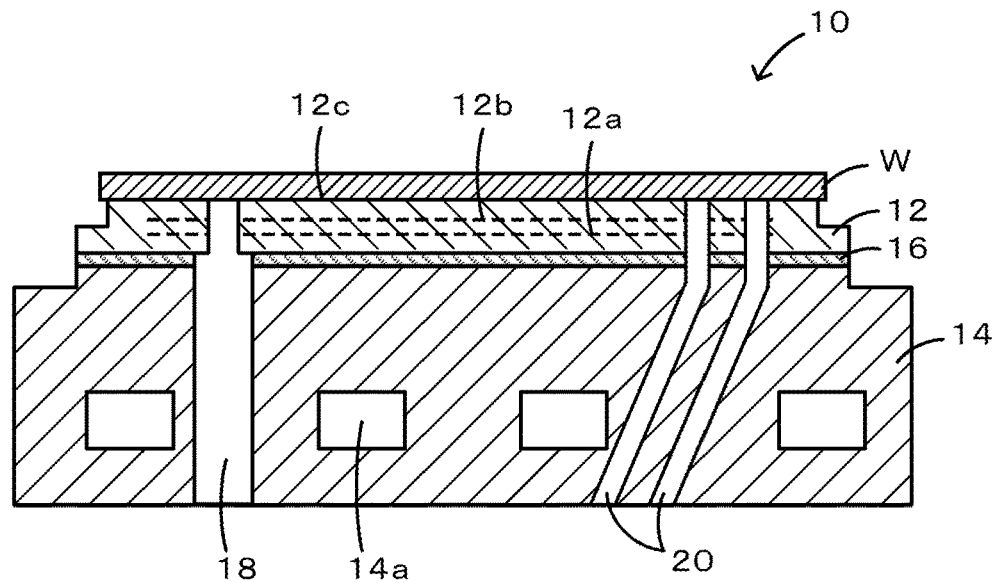
FIG. 1 is a cross-sectional view of a member 10 for semiconductor manufacturing apparatuses.

A member for semiconductor manufacturing apparatuses according to the present invention includes a ceramic component and a metal component bonded together with a thermosetting sheet. The thermosetting sheet is made of a cured epoxy-acrylic adhesive. The adhesive contains (A) an epoxy resin capable of hydrogen transfer type polyaddition, (B) an acrylate or methacrylate polymer, and (C) a curing agent.

The thermosetting sheet is made of a cured epoxy-acrylic adhesive, and the adhesive contains the three components (A) to (C).

Examples of the component (A), an epoxy resin capable of hydrogen transfer type polyaddition, include bisphenol A epoxy resins, bisphenol F epoxy resins, bisphenol AD epoxy resins, phenol novolak epoxy resins, and cresol novolak epoxy resins. Such epoxy resins produce little or no low-molecular substance during the curing reactions.

Examples of the component (B), an acrylate or methacrylate polymer, include acrylic rubbers having an epoxy group mainly composed of an alkyl acrylate or an alkyl methacrylate and acrylic rubbers having a carboxy group mainly composed of an alkyl acrylate or an alkyl methacrylate. Such polymers also produce little or no low-molecular substance during the curing reaction.

Examples of the component (C), a curing agent, include dicyandiamide (DICY) curing agents, imidazole curing agents, and amine curing agents.

For example, the components (A), (B), and (C) constitute 5% to 80%, 15% to 90%, and 0.1% to 5% by mass of the adhesive, respectively. In particular, when a ceramic component and a metal component, one or both of which have a hole, are bonded together, in order to reduce the amount by which the adhesive is squeezed out, the mass percentage constituted by the component (A) is preferably lower than the mass percentage constituted by the component (B). More preferably, the component (A) content ranges from 19% to 36% by mass, the component (B) content ranges from 60% to 80% by mass, and the component (C) content ranges from 1% to 4% by mass. As another component, a carboxyl-terminated butadiene-acrylonitrile copolymer liquid rubber (CTBN) may constitute less than 1% by mass of the adhesive.

Preferably, the rate of change in weight of the adhesive calculated from [(the weight of the adhesive before curing—the weight of the adhesive after curing under vacuum at 150° C. for 20 hours)/the weight of the adhesive before curing] is 5% by mass or less. Preferably, the adhesive has a shear strength of 0.3 MPa or more, a shear strain of 1.4 or more, and a shear elastic modulus Z in the range of $0.048 \leq Z \leq 2.350$ after bonding of the ceramic component and the metal component and before and after a thermal history of 150° C. for 1000 hours. Preferably, the modulus of elasticity of the adhesive, after bonding of the ceramic component and the metal component, is increased by 60% or less after 150° C. for 1000 hours. Preferably, the rate of change in the thermal conductivity of the adhesive, after bonding of the ceramic component and the metal component, is 10% or less before and after a thermal history of 150° C. for 1000 hours. Preferably, when adherends are disposed on both sides of an adhesive sheet, which is a sheet before heat curing treatment of the adhesive, and 0.1 to 1.0 MPa is applied to the adherends, an amount by which the adhesive is squeezed out from a side surface of the adhesive sheet is 1.1 mm or less.

Examples of a member for semiconductor manufacturing apparatuses according to the present invention include heaters, electrostatic chucks, rings, and showerheads. Examples of the heaters include electrostatic chuck heaters, etching heaters, CVD heaters, PVD heaters, and ring heaters. Examples of the electrostatic chucks include electrostatic chucks only including an electrostatic electrode buried therein and electrostatic chucks including an electrostatic electrode and a heater electrode buried therein. The rings and the showerheads may include a heater or no heater. Examples of the ceramic component include aluminum nitride, alumina, silicon carbide, boron nitride, yttria, and magnesia components. Examples of the metal component include aluminum, aluminum alloy, brass, and molybdenum components.

FIG. 1 illustrates a member for semiconductor manufacturing apparatuses according to an embodiment of the present invention. The member 10 for semiconductor manufacturing apparatuses illustrated in FIG. 1 includes a ceramic electrostatic chuck 12 and a metallic cooling plate 14 bonded together with a thermosetting sheet 16. The electrostatic chuck 12 includes an electrostatic electrode 12b and a heater electrode 12a buried therein. A surface of the electrostatic chuck 12 is a wafer mounting face 12c on which a wafer W is to be mounted. The cooling plate 14 includes a cooling channel 14a through which a refrigerant can circulate. The member 10 for semiconductor manufacturing apparatuses further includes a plurality of holes passing through the electrostatic chuck 12 and the cooling plate 14 from the top to the bottom. Such holes include a lift pin hole 18 used for lifting up the wafer W mounted on the wafer mounting face 12c and a gas channel 20 through which a backside gas is supplied to the wafer W. The thermosetting sheet 16 is made of a cured epoxy-acrylic adhesive. The adhesive contains (A) an epoxy resin capable of hydrogen transfer type polyaddition, (B) an acrylate or methacrylate polymer, and (C) a curing agent.

One exemplary manner in which the member 10 for semiconductor manufacturing apparatuses is to be used will be described below. The member 10 for semiconductor manufacturing apparatuses is placed in a chamber (not shown). The wafer W is mounted on the wafer mounting face 12c. A voltage at which the electrostatic electrode 12b adsorbs the wafer W is applied to the electrostatic electrode 12b. A voltage is applied to the heater electrode 12a in order to heat the wafer W. While a raw material gas is introduced into the chamber, the wafer W is treated with plasma. In order to prevent an excessive increase in temperature of the wafer W due to plasma, a refrigerant flows through the cooling channel 14a in the cooling plate 14. In order to improve the heat conduction between the wafer W and the wafer mounting face 12c, a backside gas, such as helium, is introduced into the gas channel 20. After the treatment of the wafer W, a lift pin (not shown) in the lift pin hole 18 is raised to lift the wafer W over the wafer mounting face 12c, and the wafer W is removed.

Although the member 10 for semiconductor manufacturing apparatuses includes the ceramic electrostatic chuck 12 and the metallic cooling plate 14 bonded together with the thermosetting sheet 16, the member 10 for semiconductor manufacturing apparatuses is resistant to high temperatures.

EXAMPLES

[1] Adhesive Sheet

An adhesive sheet according to Example 1 contains a bisphenol F epoxy resin, an acrylic rubber having an epoxy group mainly composed of butyl acrylate, and a dicyandiamide (DICY) curing agent, which constitute 19%, 80%, and 1% by mass of the adhesive sheet, respectively. The adhesive sheet is prepared by vaporizing a volatile solvent (such as acetone or hexane) of adhesives each containing a corresponding one of the components diluted with the volatile solvent and thereby forming a sheet.

An adhesive sheet according to Example 2 contains a cresol novolak epoxy resin, an acrylic rubber having an epoxy group mainly composed of ethyl acrylate, and an imidazole curing agent, which constitute 29%, 70%, and 1% by mass of the adhesive sheet, respectively.

An adhesive sheet according to Example 3 contains a bisphenol A epoxy resin, an acrylic rubber having a carboxy group mainly composed of butyl acrylate, and an amine curing agent, which constitute 36%, 60%, and 4% by mass of the adhesive sheet, respectively.

An adhesive sheet according to Example 4 contains a bisphenol F epoxy resin, an acrylic rubber having an epoxy group mainly composed of butyl acrylate, and a DICY curing agent, which constitute 57%, 40%, and 3% by mass of the adhesive sheet, respectively.

An adhesive sheet according to Example 5 contains a bisphenol F epoxy resin, an acrylic rubber having an epoxy group mainly composed of butyl acrylate, and a DICY curing agent, which constitute 76%, 20%, and 4% by mass of the adhesive sheet, respectively.

The adhesive sheets according to Examples 1 to 5 may contain a carboxyl-terminated butadiene-acrylonitrile copolymer liquid rubber (CTBN), which constitutes less than 1% by mass of the adhesive sheet.

An adhesive sheet according to Comparative Example 1 is an acrylic resin sheet.

An adhesive sheet according to Comparative Example 2 contains a bisphenol A epoxy resin, a DICY curing agent, and dimethylurea, which constitute 90%, 7%, and 3% by mass of the adhesive sheet, respectively.

[2] Weight Change Test in Vacuum Drying

An adhesive sheet was bonded to a 50-mm square aluminum plate. The rate of change in weight of the adhesive sheet due to curing was measured. The rate of change in weight due to curing was calculated from (the weight of the adhesive sheet before curing—the weight of the adhesive sheet after curing)/the weight of the adhesive sheet before curing. The weight after curing was measured in the atmosphere after the adhesive sheet was placed under vacuum at 10 Pa or less at 150° C. for 20 hours. The rate of change in weight of the adhesive sheet due to curing was in the range of 2% to 5% by mass in Examples 1 to 5, 7% by mass in Comparative Example 1, and 6% by mass in Comparative Example 2. The weight loss in Comparative Example 2 resulted from the production of water due to condensation of the epoxy in the curing reaction. Thus, the rate of change in resin weight due to curing is preferably 5% by mass or less.

[3] Shear Test for Bonded Piece

Figure 2:
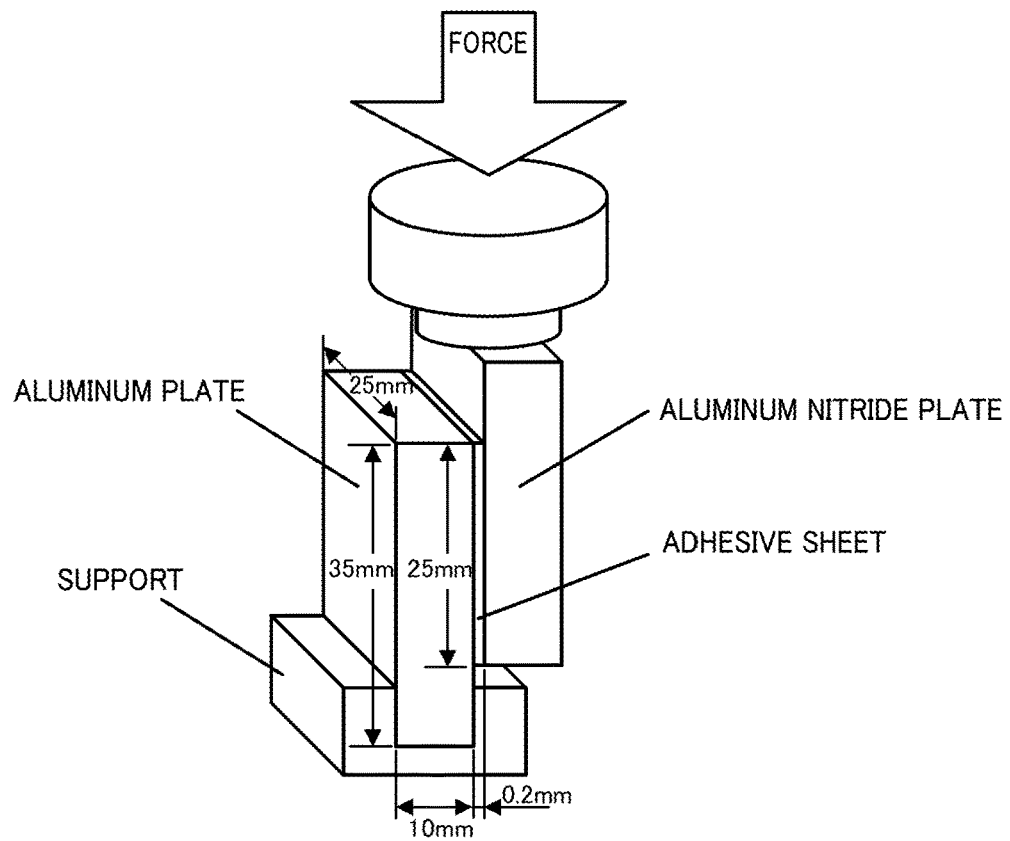
FIG. 2 is an explanatory view of a shear test apparatus.

As illustrated in FIG. 2, a bonded piece for a shear test was prepared by bonding an aluminum plate 25 mm in length, 35 mm in width, and 10 mm in thickness to an aluminum nitride plate having the same size as the aluminum plate with an adhesive sheet while the aluminum plate partly overlapped the aluminum nitride plate. The bonded portion was 25 mm in length, 25 mm in width, and 0.2 mm in thickness. The shear test was performed by placing the bonded piece on a support such that the 25 mm×10 mm face of the aluminum plate faced downward and vertically applying downward force to the aluminum nitride plate. The test temperature was room temperature. A graph of the relationship between strength (stress) and strain was drawn from the results of the shear test (see FIG. 3). The shear strength and the shear elongation were determined from the graph. The shear test was performed before and after a thermal history of 150° C. for 1000 hours.

Figure 3:
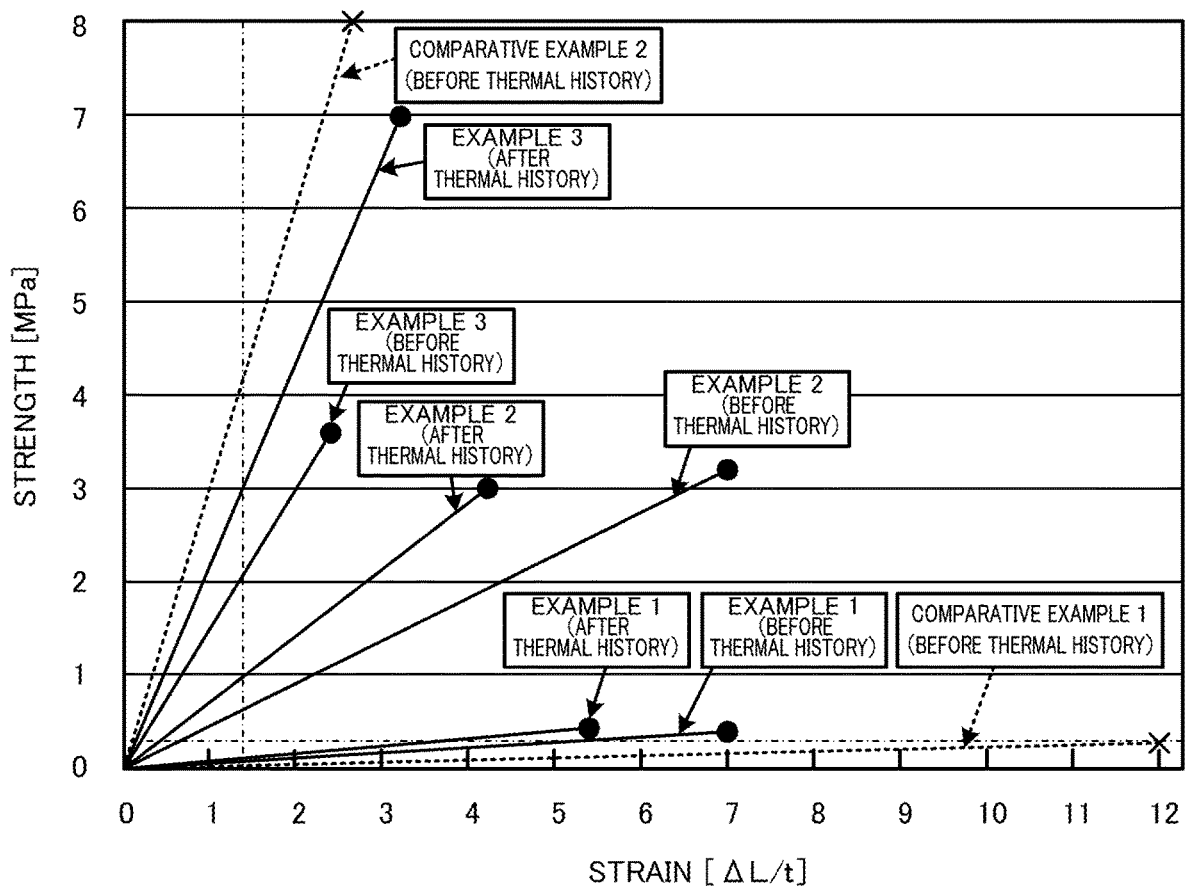
FIG. 3 is a graph of the relationship between shear strain and shear strength.

Before the thermal history, Examples 1 to 5 had a higher shear strength than Comparative Example 1. The adhesive sheet according to Comparative Example 1, which was an acrylic resin sheet containing a low-molecular substance, had a significant decrease in shear strength after the thermal history, resulting in separation of the aluminum plate from the aluminum nitride plate. FIG. 3 therefore includes no data of Comparative Example 1 after the thermal history. The results for Examples 4 and 5 were included in the range of the results for Examples 1 to 3 and were not plotted. The shear strength of Examples 1 to 5 after the thermal history was greater than or equal to the shear strength before the thermal history.

The shear strain of Examples 1 to 5 before the thermal history was greater than the shear strain of the adhesive sheet according to Comparative Example 2. The adhesive sheet according to Comparative Example 2, which contained the epoxy material, contained epoxy in excess. Thus, the adhesive sheet according to Comparative Example 2 had high strength before and after the thermal history but had a short elongation (shear strain). FIG. 3 includes no data of Comparative Example 2 after the thermal history. The results for Examples 4 and 5 were included in the range of the results for Examples 1 to 3 and were not plotted. The shear strain of Examples 1 to 5 after the thermal history was slightly smaller than or equal to the shear strain before the thermal history.

Thermal stress calculation showed that the shear strain needed to be 1.4 or more, and the shear strength needed to be 0.3 MPa or more. As a result of the investigation of heat curing of the adhesive sheets according to Examples 1 to 5 in combination with the results for practical operation of the applications [6] to described below, the modulus of elasticity Z (=strength/strain) needed to satisfy $0.048 \leq Z \leq 2.350$. The lower limit 0.048 was determined from the data of Example 1 before the thermal history. The upper limit 2.350 was determined from the data of Example 3 after the thermal history.

The rate of change in modulus of elasticity due to the thermal history of 150° C. for 1000 hours in a room temperature test was 60% or less for Examples 1 to 5. The rate of change was calculated from (the modulus of elasticity at room temperature after the thermal history—the modulus of elasticity at room temperature before the thermal history)/the modulus of elasticity at room temperature before the thermal history. In Comparative Example 1, the rate of change in modulus of elasticity was approximately 80%. However, because of its small shear strain, Comparative Example 1 had a separation at an end portion in the applications [6] to [9] described below. In Comparative Example 2, the rate of change in modulus of elasticity was more than 100%, and a crack occurred in a ceramic portion in the applications described below. These results show that when the rate of change in the modulus of elasticity of an adhesive sheet is 60% or less the adhesive sheet can be used in the applications described below.

The same test was performed using the adhesive sheets according to Examples 1 to 5 and a material of the ceramic plate other than aluminum nitride, such as alumina, silicon carbide, boron nitride, yttria, or magnesia, or a material of the metal sheet other than aluminum, such as an aluminum alloy, brass, molybdenum, SiSiC, or AlSiC. There was no problem with adhesion.

[4] Thermal Degradation Test for Thermal Conductivity of Bonded Piece

The thermal conductivity of a bonded piece that included an aluminum nitride plate (10 mm in diameter and 1 mm in thickness) and an aluminum plate (10 mm in diameter and 2 mm in thickness) bonded together with an adhesive sheet was measured using a laser flash method. The thermal conductivity of the adhesive sheet (thermosetting sheet) was calculated by subtracting the known thermal conductivities of aluminum nitride (90 W/mK) and aluminum (160 W/mK) from the thermal conductivity of the bonded piece. The thermal conductivities of the adhesive sheets according to Comparative Examples 1 and 2 decreased after a durability test of 150° C. for 1000 hours in the air. However, the thermal conductivities of the adhesive sheets according to Examples 1 to 5 did not decrease. This is probably because the adhesive in Comparative Example 1 was an acrylic adhesive having low heat resistance. This is probably because although an acrylic-epoxy adhesive was used in Comparative Example 2 water produced by condensation decreased adhesion. In contrast, the epoxy-acrylic adhesives in Examples 1 to 5 basically had high heat resistance and did not produce low-molecular substances, such as water and hydrocarbon compounds, in curing and therefore had sufficient adhesion.

[5] Squeeze-Out Test of Adhesive Sheet Before Curing

In order to produce heat resistance in the applications described below, an adhesive sheet must be subjected to curing treatment by placing the adhesive sheet between adherends and heating the adhesive sheet at a pressure in the range of 0.1 to 1.0 MPa at a temperature in the range of 100° C. to 170° C. In the applications described below, in order to perform each function, the adherends may have a hole passing therethrough in the thickness direction. An excessively soft adhesive sheet may block the hole and thereby disrupt the functions in the applications or may have variations in thickness due to local stress concentration and thereby exert an influence on temperature uniformity. Thus, the amount by which the adhesive was squeezed out into a hole having a diameter of 10 mm in adherends disposed on both sides of an adhesive sheet was measured while a pressure in the range of 0.1 to 1.0 MPa was applied to the adherends at 130° C. for one hour. The adhesive sheet had a thickness of 0.2 mm, and the adherends had a thickness of 3 mm. The amount by which the adhesive is squeezed out was measured as the length of the adhesive protruding from the edge to the center of the hole. Table 1 shows the results. As is clear from Table 1, the amount by which the adhesive was squeezed out in Examples 1 to 3 at a maximum pressure of 1.0 MPa ranged from 0.51 to 1.01 mm, and the adhesive negligibly filled the hole. The amount by which the adhesive was squeezed out in Examples 4 and 5 ranged from 1.82 to 2.45 mm, and the adhesive slightly filled the hole.

TABLE 1

| Pressure at 130° C. [MPa] | Amount of Adhesive Squeezed Out into φ 10 mm Hole [mm] | | | | |
|---|---|---|---|---|---|
| | EXAMPLE 1 | EXAMPLE 2 | EXAMPLE 3 | EXAMPLE 4 | EXAMPLE 5 |
| 0.1 | 0.05 | 0.12 | 0.17 | 0.21 | 0.23 |
| 0.2 | 0.10 | 0.20 | 0.24 | 0.33 | 0.49 |
| 0.3 | 0.15 | 0.25 | 0.30 | 0.51 | 0.73 |
| 0.4 | 0.20 | 0.31 | 0.42 | 0.70 | 0.99 |
| 0.5 | 0.26 | 0.40 | 0.53 | 0.87 | 1.18 |
| 0.6 | 0.31 | 0.45 | 0.61 | 1.02 | 1.45 |
| 0.7 | 0.35 | 0.52 | 0.72 | 1.22 | 1.69 |
| 0.8 | 0.41 | 0.61 | 0.79 | 1.45 | 1.93 |
| 0.9 | 0.46 | 0.75 | 0.91 | 1.65 | 2.20 |
| 1.0 | 0.51 | 0.82 | 1.01 | 1.82 | 2.45 |
| State of Hole | ◎ | ○ | ○ | Δ | Δ |

◎: The adhesive negligibly filled the hole (best condition).
○: The adhesive negligibly filled the hole.
Δ: The adhesive slightly filled the hole.

[6] Heat Cycle Test of Bonded Piece of End-Product Size (Electrostatic Chuck Heater)

Figure 4:
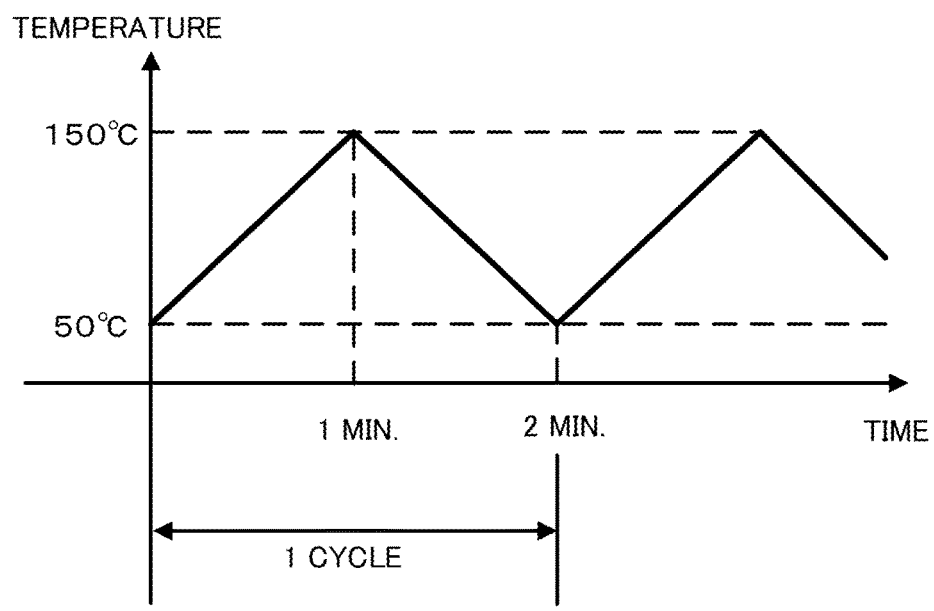
FIG. 4 is a graph of the relationship between time and temperature in a heat cycle test.

An alumina electrostatic chuck (300 mm in diameter and 5 mm in thickness) having a gas hole and an Al cooling plate (300 mm in diameter and 30 mm in thickness) having a gas hole were bonded together with an adhesive sheet to make an electrostatic chuck heater. The electrostatic chuck heater was subjected to a heat cycle test. The flatness of a wafer mounting face of the electrostatic chuck and gas leak at the bonding interface were examined before and after the test. The gas leak was assessed as He leak by plugging the gas hole in the electrostatic chuck, evacuating the gas hole in the cooling plate with a He leak detector, and blowing He on the bonded portion. As illustrated in FIG. 4, the heat cycle test included cycles of heating from 50° C. to 150° C. for one minute and cooling from 150° C. to 50° C. for one minute (the same applies hereinafter). The electrostatic chuck heater including the adhesive sheet according to Comparative Example 1 sprung a leak at 100 cycles, but the electrostatic chuck heaters including the adhesive sheets according to Examples 1 to 5 did not have a leak even at 10000 cycles. All the electrostatic chuck heaters had satisfactory flatness (less than 50 μm). An electrostatic chuck having no heater had the same characteristics. An electrostatic chuck made of aluminum nitride and a heater having no electrostatic chuck function had the same characteristics.

[7] Heat Cycle Test of Bonded Piece of End-Product Size (Ring)

An aluminum nitride ring (310 mm in inner diameter, 350 tun in outer diameter, and 5 mm in thickness) and an aluminum cooling plate (310 mm in inner diameter, 350 mm in outer diameter, and 20 mm in thickness) were bonded together with an adhesive sheet to make a ring. The ring was subjected to the heat cycle test, and flatness was evaluated before and after the heat cycle test. The adhesive sheet according to Comparative Example 1 separated at 100 cycles, but the adhesive sheets according to Examples 1 to 5 did not separate and had satisfactory flatness even at 10000 cycles (less than 50 μm). A ring made of alumina and a ring including a heater had the same characteristics.

[8] Heat Cycle Test of Bonded Piece of End-Product Size (Showerhead)

A silicon carbide component (420 mm in diameter and 10 mm in thickness) having a gas hole and an aluminum component (420 mm in diameter and 30 mm in thickness) having a gas hole were bonded together with an adhesive sheet to make a showerhead. The showerhead was subjected to the heat cycle test, and flatness and gas leak at the bonding interface were examined before and after the heat cycle test. The gas leak was assessed as He leak by plugging the gas hole in the silicon carbide component, evacuating the gas hole in the aluminum component with a He leak detector, and blowing He on the bonded portion. The showerhead including the adhesive sheet according to Comparative Example 1 sprung a leak at 100 cycles, but the showerheads including the adhesive sheets according to Examples 1 to 5 did not have a leak even at 10000 cycles. All the showerheads had satisfactory flatness (less than 50 μm).

[9] Heat Cycle Test of Bonded Piece of End-Product Size (CVD Heater)

An end portion of an aluminum nitride shaft (100 mm in diameter) of a CVD heater was bonded to an aluminum component (100 mm in diameter). When the adhesive sheet according to Comparative Example 1 was used, the aluminum component separated at 10 cycles in the heat cycle test. When the adhesive sheets according to Examples 1 to 5 were used, the aluminum component did not separate even at 1000 cycles.

The present invention is not limited to the above-described embodiment. It is clear that the present invention can be implemented in a variety of embodiments without departing from the technical scope thereof.

The present application claims priority from Japanese Patent Application No. 2013-054840 filed on Mar. 18, 2013, the entire contents of which are incorporated herein by reference.

What is claimed is:

1. A member for semiconductor manufacturing apparatuses, comprising a ceramic component and a metal component bonded together with a thermosetting sheet, wherein
the thermosetting sheet is made of a cured epoxy-acrylic adhesive,
the cured epoxy-acrylic adhesive comprising (A) an epoxy resin capable of hydrogen transfer polyaddition, (B) an acrylic rubber selected from the group consisting of acrylic rubbers having an epoxy group mainly composed of an alkyl acrylate or an alkyl methacrylate and acrylic rubbers having a carboxy group mainly composed of alkyl acrylate or alkyl methacrylate, and (C) a curing agent, and
an amount of the epoxy resin is 9 to 29 times greater than an amount of the curing agent,
wherein a mass percentage constituted by the epoxy resin is lower than a mass percentage constituted by the acrylic rubber,
wherein the cured epoxy-acrylic adhesive, after bonding of the ceramic component and the metal component, has a shear strength of 0.3 MPa or more, a shear strain of 1.4 or more, and a shear elastic modulus Z in a range of 0.048 Z 2.350 before and after a thermal history of 150° C. for 1000 hours, and
wherein, when adherends are disposed on both sides of an adhesive sheet, which is a sheet before heat curing treatment of the cured epoxy-acrylic adhesive, and pressures of 0.1 to 1.0 MPa are applied at 130° C. for one hour to the adherends, an amount by which the cured epoxy-acrylic adhesive is squeezed out from a side surface of the adhesive sheet is 0.90 mm or less.

2. The member for semiconductor manufacturing apparatuses according to claim 1, wherein a rate of change in weight of the cured epoxy-acrylic adhesive calculated from [(weight of the cured epoxy-acrylic adhesive before curing - weight of the cured epoxy-acrylic adhesive after curing under vacuum at 150° C. for 20 hours)/weight of the cured epoxy-acrylic adhesive before curing] is 5% by mass or less.

3. The member for semiconductor manufacturing apparatuses according to claim 1, wherein a modulus of elasticity of the cured epoxy-acrylic adhesive, after bonding of the ceramic component and the metal component, is increased by 60% or less after a thermal history of 150° C. for 1000 hours.

4. The member for semiconductor manufacturing apparatuses according to claim 1, wherein a rate of change in thermal conductivity of the cured epoxy-acrylic adhesive, after bonding of the ceramic component and the metal component, is 10% or less before and after a thermal history of 150° C. for 1000 hours.

5. The member for semiconductor manufacturing apparatuses according to claim 1, wherein the member for semiconductor manufacturing apparatuses is one selected from the group consisting of heaters, electrostatic chucks, rings, and showerheads.

6. The member for semiconductor manufacturing apparatuses according to claim 1, wherein
the ceramic component is a material selected from the group consisting of aluminum nitride, alumina, silicon carbide, boron nitride, yttria, and magnesia, and
the metal component is a material selected from the group consisting of aluminum, aluminum alloys, brass, molybdenum, SiSiC, and AlSiC.

7. The member for semiconductor manufacturing apparatuses according to claim 1, wherein the curing agent is a single curing agent selected from the group consisting of dicyandiamide curing agents, imidazole curing agents, and amine curing agents.

* * * * *